United States Patent
Ishiguro (10) Patent No.: US 7,812,685 B2
(45) Date of Patent: Oct. 12, 2010

(54) AUTOMATIC REGULATOR OF FILTER

(75) Inventor: Kazuhisa Ishiguro, Gunma (JP)

(73) Assignee: Ricoh Co., Ltd., Tokyo (JP)

( * ) Notice: Subject to any disclaimer, the term of this patent is extended or adjusted under 35 U.S.C. 154(b) by 192 days.

(21) Appl. No.: 12/097,013

(22) PCT Filed: Jul. 12, 2006

(86) PCT No.: PCT/JP2006/314209
§ 371 (c)(1),
(2), (4) Date: Jun. 11, 2008

(87) PCT Pub. No.: WO2007/069359
PCT Pub. Date: Jun. 21, 2007

(65) Prior Publication Data
US 2009/0128259 A1    May 21, 2009

(30) Foreign Application Priority Data
Dec. 12, 2005 (JP) .............................. 2005-357302

(51) Int. Cl.
*H04B 3/04* (2006.01)
(52) U.S. Cl. ..................... 333/17.1; 333/174
(58) Field of Classification Search ............... 333/17.1, 333/172–174; 327/553
See application file for complete search history.

(56) References Cited

U.S. PATENT DOCUMENTS

| | | | | |
|---|---|---|---|---|
| 4,818,903 A | * | 4/1989 | Kawano | 327/553 |
| 5,179,727 A | * | 1/1993 | Imagawa | 455/182.3 |
| 5,200,716 A | * | 4/1993 | Amano | 333/17.1 |
| 6,307,443 B1 | * | 10/2001 | Gabara | 333/17.1 |

FOREIGN PATENT DOCUMENTS

| | | |
|---|---|---|
| JP | 04-077105 | 3/1992 |
| JP | 2000-040366 | 2/2000 |
| JP | 2001-308683 | 11/2001 |
| JP | 2005-286913 | 10/2005 |

* cited by examiner

*Primary Examiner*—Robert Pascal
*Assistant Examiner*—Alan Wong
(74) *Attorney, Agent, or Firm*—Connolly Bove Lodge & Hutz LLP (57) ABSTRACT

A second operational amplifier (7) is arranged, as an interface circuit (6), between a first operational amplifier (5) outputting the control voltage (Vcd) of a dummy filter (2) and a main filter (1), and the reference voltage (Vr) of the second operational amplifier (7) is optimized such that the control voltage (Vcd) obtained by using the dummy filter (2) is converted through the interface circuit (6) into a control voltage (Vcm) most suitable for the main filter (1), thereby obtaining a control voltage (Vcm) most suitable for regulating the frequency characteristics of the main filter (1) to desired characteristics.

3 Claims, 6 Drawing Sheets

| ITEM | T=25°C | T=-40°C | T=100°C |
|---|---|---|---|
| Vcd | Vcd1 | Vcd2 | Vcd3 |
| Vcm | Vcm1 | Vcm2 | Vcm3 |

Fig. 7

$$Vcm1 = \frac{Vcd1}{2}\left(1+\frac{R6}{R5}\right) - Vr\frac{R6}{R5} = Vcd1 - Vr \quad \cdots \text{FORMULA 1}$$

Fig. 8

| CONDITIONS | CONVERGED VALUE | DEVIATION SCORE |
|---|---|---|
| VDD=3V, T=25°C | 49.8KHz | -0.4% |
| VDD=3V, T=100°C | 49.3KHz | -1.4% |
| VDD=3V, T=-40°C | 50.6KHz | +1.2% |
| VDD=1.8V, T=25°C | 49.1KHz | -1.8% |
| VDD=3.6V, T=25°C | 50.8KHz | +1.6% |
| C=-5% | 50.6KHz | +1.2% |

※ DEVIATION SCORES ARE OBTAINED COMPARED TO 50 KHz

AUTOMATIC REGULATOR OF FILTER

This application is a national phase of PCT/JP2006/314209, filed Jul. 12, 2006, which claims priority to JP 2005-357302, filed Dec. 12, 2005, the contents of all are hereby incorporated by reference.

TECHNICAL FIELD

The present invention relates to an automatic regulator of a filter, and in particular, is suitable for using in an apparatus which can automatically regulate frequency characteristics of a filter circuit which performs predetermined filtering processing to an input signal.

BACKGROUND ART

Generally, as for filter circuits, such as a BPF (Band Pass Filter) used for wireless communication devices, very high accuracy is requested in frequency characteristics. Then, in order to prevent frequency characteristics from shifting from desired characteristics by a shift of resistance or capacitance resulting from variations in elements when incorporating a filter circuit in an IC (integrated circuit), an automatic regulator of a filter is used.

The automatic regulator of a filter is constructed by providing a dummy filter circuit (dummy filter) in addition to a filter circuit (main filter) which performs original filtering processing to an input signal (e.g., refer to patent document 1). Although a BPF constructs a dummy filter in this patent document 1, there is also the one which uses a VCF (Voltage Controlled Filter), which is constructed of a secondary LPF (Low-Pass Filter), as the dummy filter.

Patent document 1: Japanese Patent Laid-Open No. 9-98446

Figure 1:
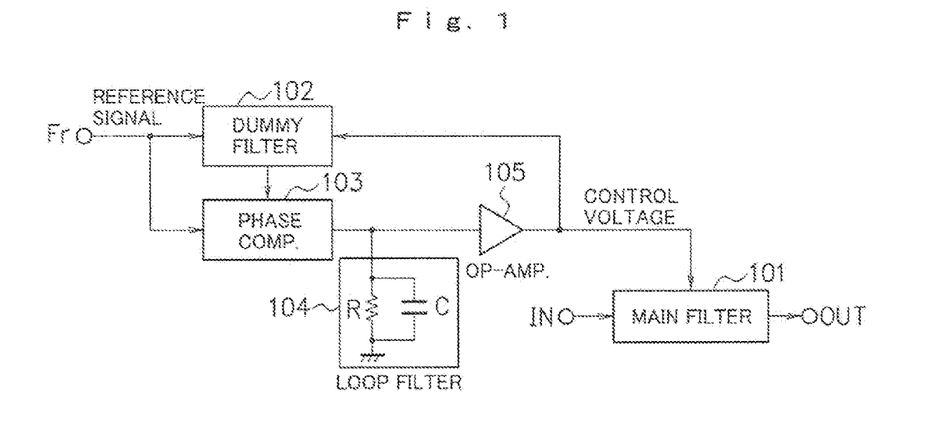
FIG. 1 is a diagram showing a conventional automatic regulator of a filter.

FIG. 1 is a diagram showing a conventional automatic regulator of a filter. In FIG. 1, reference numeral 101 denotes a main filter, which performs original filtering processing to an input signal. Reference numeral 102 denotes a dummy filter, which performs filtering processing to a reference signal Fr of a reference frequency. This dummy filter 102 is constructed in the same form as that of the main filter 101. For example, when the main filter 101 is constructed of a Butterworth filter, the dummy filter 102 is also done of a Butterworth filter, or when the main filter 101 is constructed of a Chebyshev filter, the dummy filter 102 is also done of a Chebyshev filter.

Reference numeral 103 denotes a phase comparator, which detects a phase difference between the reference signal Fr and a signal outputted from the dummy filter 102, and outputs a phase error signal according to the phase difference. Generally, as for a secondary filter, a phase of an output signal changes from 0° to 180° according to a change of an input frequency. Since a secondary filter is used for the dummy filter 102, if a cut-off frequency of the dummy filter 102 does not shift from a desired value (if it is in an ideal state), an output of the phase comparator 103 is converged in a state that a phase difference shifts by 90°. However, when the cut-off frequency of the dummy filter 102 shifts from the desired value by variations in elements, etc., the phase difference of the output of the phase comparator 103 becomes 90°+Δθ. The phase comparator 103 outputs a phase error signal for the error phase equivalent to this shift Δθ.

Reference numeral 104 denotes a loop filter, which is constructed of a parallel circuit of a resistor R and a capacitor C. This loop filter 104 outputs a signal proportional to the error phase detected by the phase comparator 103 by discharging and charging electric charges of the capacitor C on the basis of the phase error signal outputted from the phase comparator 103. Reference numeral 105 denotes an operational amplifier, which is inserted between the loop filter 104 and dummy filter 102 in order to raise a loop gain. The signal outputted from the loop filter 104 is fed back to the dummy filter 102 as a control voltage for the dummy filter 102 through the operational amplifier 105.

As described above, while the reference signal Fr of the reference frequency is inputted into the dummy filter 102 and phase comparator 103, an output of the dummy filter 102 is inputted into the phase comparator 103. Then, the output of the phase comparator 103 is inputted into the dummy filter 102 through the loop filter 104 and operational amplifier 105 as a control voltage. As the result, the dummy filter 102 is regulated, automatically. That is, even if the cut-off frequency of the dummy filter 102 shifts from the desired value by the variations in elements, etc. (even if the phase difference of the output of the phase comparator 103 shifts from 90°), it is regulated so that the phase difference may be 90° by a control loop using the phase error signal outputted from the phase comparator 103.

As described above, the main filter 101 is constructed in the same form as that of the dummy filter 102. Thereby, it is possible to perform an automatic regulation of the main filter 101 by inputting the control voltage for the dummy filter 102 also as a control voltage for the main filter 101. Namely, even if the cut-off frequency of the main filter 101 shifts from the desired value by the variations in elements, etc. (even if a phase of an output signal shifts from 90°), it is regulated by the phase error signal outputted from the phase comparator 103 so that the phase of the output signal of the main filter 101 may be 90°.

DISCLOSURE OF THE INVENTION

Nevertheless, generally, since an order of the dummy filter 102 differed from an order of the main filter 101, there was a problem that it was not possible to regulate correctly the frequency characteristics of the main filter 101 even if the control voltage generated using the dummy filter 102 was applied to the main filter 101 as it was. In addition, there was a problem that, when a supply voltage and surrounding environmental temperature fluctuate, the control voltage for the dummy filter 102 shifts from the desired value, and hence, it became impossible to regulate the frequency characteristics of the main filter 101 correctly.

The present invention is formed in order to solve such problems, and aims at being able to regulate frequency characteristics of a main filter to desired characteristics even if an order of the dummy filter differs from an order of the main filter.

In addition, the present invention aims at being able to regulate frequency characteristics of a main filter to desired characteristics even if there is fluctuation of a supply voltage or environmental temperature.

In order to solve the above-mentioned problems, in the present invention, a second operational amplifier is arranged as an interface circuit between a first operational amplifier, which output a control voltage for a dummy filter, and a main filter, and a reference voltage of the second operational amplifier is optimised. Namely, a voltage having a value equal to a difference between a desired value of the control voltage of the main filter required to obtain a desired frequency characteristics of the main filter, and a desired value of the control voltage for the dummy filter required to obtain desired frequency characteristics of the dummy filter is fed as a reference voltage of the second operational amplifier.

In another aspect of the present invention, a bias voltage of the first operational amplifier is made to fluctuate depending on a change of a supply voltage. Specifically, it comprises first resistors for voltage dividing which perform voltage dividing of the supply voltage according to a resistance ratio, and a third operational amplifier which inputs and amplifies the voltage divided by the first resistors for voltage dividing, and outputs a result thereof as the bias voltage.

In another aspect of the present invention, a reference voltage of a second operational amplifier is made to fluctuate depending on a change of surrounding environmental temperature and a supply voltage. Specifically, it comprises an MOS diode which operates according to a supply voltage, and second resistors for voltage dividing which generates a reference voltage by performing voltage dividing oil a threshold level voltage of the MOS diode according to a resistance ratio.

According to the present invention constructed as described above, even if an order of the main filter differs from an order of the dummy filter, a control voltage obtained by using the dummy filter is converted into a most suitable control voltage for the main filter by the interface circuit. Thereby, it becomes possible to obtain the control voltage required to regulate the frequency characteristics of the main filter to the desired characteristic, and it becomes possible to obtain the desired frequency characteristics almost near an ideal of the main filter.

According to another feature of the present invention, a bias voltage inputted into a first operational amplifier which outputs a control voltage for a dummy filter comes to change with fluctuation of a supply voltage. Thereby, it is possible to obtain a most suitable control voltage required to regulate the frequency characteristics of a dummy filter to the desired characteristics even if a supply voltage fluctuates. Therefore, when the control voltage for this dummy filter is converted by the interface circuit, it is also possible to obtain the most suitable control voltage required to regulate the frequency characteristics of the main filter to the desired characteristics. Thereby, it becomes possible to obtain the desired frequency characteristics almost near an ideal of the main filter regardless of a fluctuation of a supply voltage.

According to another feature of the present invention, a reference voltage inputted into a second operational amplifier which outputs a control voltage for a main filter comes to change depending on fluctuation of surrounding environmental temperature and a supply voltage. Thereby, even if the environmental temperature and supply voltage fluctuate, it becomes possible to obtain the most suitable control voltage required to regulate the frequency characteristics of the main filter to the desired characteristics, and it becomes possible to obtain the desired frequency characteristics almost near an ideal of the main filter.

BEST MODE FOR CARRYING OUT THE INVENTION

Figure 2:
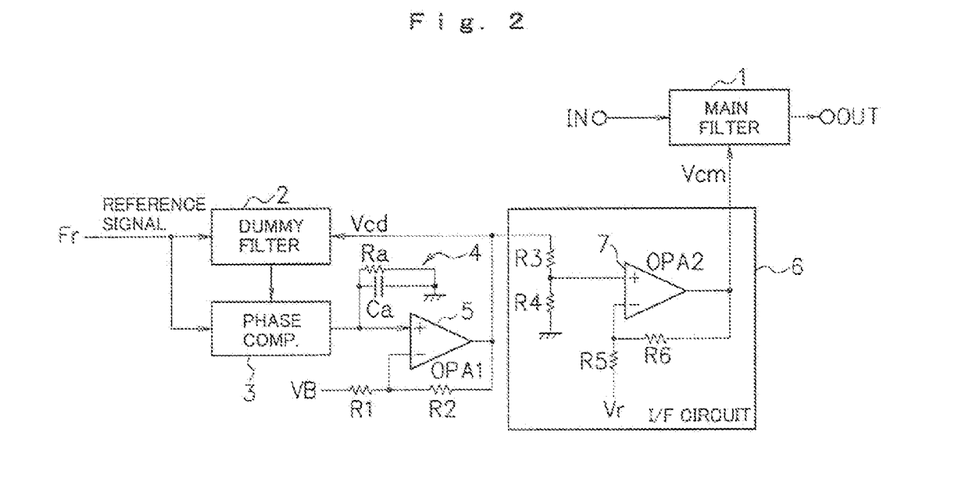
FIG. 2 is a diagram showing a structural example of an automatic regulator of a filter according to this embodiment.

An embodiment of the present invention will be described below on the basis of drawings. FIG. 2 is a diagram showing a structural example of an automatic regulator of a filter according to this embodiment. In FIG. 2, reference numeral 1 denotes a main filter, which performs original filtering processing to a signal inputted from an input terminal IN and outputs the result from an output terminal OUT. This main filter 1 is constructed of high orders of LPF, HPF, BPF, or BEF, for example.

Reference numeral 2 denotes a dummy filter, which is constructed of, for example, a secondary order of LPF, and performs filtering processing to a reference signal Fr of the reference frequency. This dummy filter 2 is constructed in the same form as that of the main filter 1. For example, when the main filter 1 is constructed of a Butterworth filter, the dummy filter 2 is also done of a Butterworth filter, or when the main filter 1 is constructed of a Chebyshev filter, the dummy filter 2 is also done of a Chebyshev filter.

Reference numeral 3 denotes a phase comparator, which detects a phase difference between the reference signal Fr of the reference frequency and a signal outputted from the dummy filter 2, and outputs a phase error signal according to the phase difference. Since the dummy filter 2 is constructed of a secondary filter, a phase of an output signal changes from 0° to 180° according to a change of an input frequency. Therefore, if the cut-off frequency of the dummy filter 2 does not shift from a desired value, an output of the phase comparator 3 is converged in a state that a phase difference shifts by 90°. However, when the cut-off frequency of the dummy filter 2 shirts from the desired value by variations in elements, etc., the phase difference of the output of the phase comparator 3 becomes 90°+Δθ. The phase comparator 3 outputs a phase error signal for the error phase equivalent to this shift Δθ.

Reference numeral 4 denotes a loop filter, which is constructed of a parallel circuit of a resistor Ra and a capacitor Ca. This loop filter 4 outputs a signal proportional to the error phase detected by the phase comparator 3 by discharging and charging electric charges of the capacitor Ca on the basis of the phase error signal outputted from the phase comparator 3.

Reference numeral 5 denotes a first operational amplifier, which is inserted between the loop filter 4 and dummy filter 2 in order to raise a loop gain. A signal outputted from the loop filter 4 is inputted into positive input terminal of the first operational amplifier 5. On the other hand, a bias voltage VB is inputted into a negative input terminal of the first operational amplifier 5 through a resistor R1. Besides, an output of the first operational amplifier 5 is inputted into a negative input terminal of the first operational amplifier 5 through a resistor R2 in a negative feedback manner. The first operational amplifier 5 amplifies the signal inputted from the loop filter 4, and feeds back the output signal to the dummy filter 2 as a control, voltage Vcd for the dummy filter 2.

As described above, in this embodiment, while the reference signal Fr of the reference frequency is inputted into the dummy filter 2 and phase comparator 3, an output of the dummy filter 2 is inputted into the phase comparator 3. Then, the output of the phase comparator 3 is inputted into the dummy filter 2 as a control voltage Vcd through the loop filter 4 and first operational amplifier 5. As the result, the dummy filter 2 is regulated automatically. That is, even if the cut-off frequency of the dummy filter 2 shifts from the desired value by the variations in elements, etc. (even if the phase difference of the output of the phase comparator 3 shifts from 90°), it is regulated so that the phase difference may be 90° by the phase error signal output fed from the phase comparator 3.

Here, a converged value of the control voltage Vcd for the dummy filter 2 changes with fluctuation of a supply voltage. So, in this embodiment, the bias voltage inputted into a negative input terminal of the first operational amplifier 5 is set so as to become equal to the converged value of the control voltage Vcd at the time when surrounding environmental temperature is at normal temperature (25° C.), there is no variation in elements of the dummy filter 2, and a supply voltage is equal to a recommended value. In addition, the bias voltage VB is made to depend on a supply voltage VDD using a circuit as shown in FIG. 3.

Figure 3:
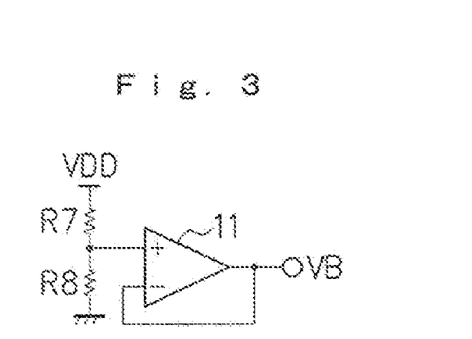
FIG. 3 is a diagram showing a structural example of a bias voltage generation circuit according to this embodiment.

FIG. 3 is a diagram showing a structural example of a generation circuit of the bias voltage VB. As shown, in FIG. 3, the bias voltage generation circuit in this embodiment is constructed by comprising resistors R7 and R8 (these are equivalent to the first resistors for voltage dividing in the present invention), and a third operational amplifier 11. The resistors R7 and R8 are connected serially between a power source and a ground, and perform voltage dividing of the supply voltage VDD into a voltage value according to a resistance ratio. The third operational amplifier 11 inputs a voltage dividing value of the supply voltage VDD into a positive input terminal, and inputs the bias voltage VB, which is an own output, into the negative input terminal in a negative feedback manner. By constructing the bias voltage generation circuit in this way, the bias voltage VB inputted into the negative input terminal of the first operational amplifier 5 changes with fluctuation of the supply voltage VDD.

In addition, in this embodiment, an interface circuit 6 is provided between the first operational amplifier 5 and main filter 1. This interface circuit 6 is constructed by comprising resistors R3 and R4, a second operational amplifier 7, and resistors R5 and R6. The resistors R3 and R4 are connected serially between an output terminal of the first operational amplifier 5, and a ground, and perform voltage dividing of the control voltage Vcd for the dummy filter 2, which is outputted from the first operational amplifier 5, into a voltage value according to a resistance ratio.

The second operational amplifier 7 inputs a voltage dividing value of the control voltage Vcd into a positive input terminal, and inputs the control voltage Vcm for the main filter 1, which is an own output, into the own negative input terminal through the resistor R6 in a negative feedback manner. A reference voltage Vr is also inputted into the negative input terminal of the second operational amplifier 7 through the resistor R5. Hereafter, the interface circuit 6 constructed in this way will be described in detail.

As mentioned above, the main filter 1 and dummy filter 2 are made to be in the same filter form. This is a conventional way of thinking for making it possible to use the control voltage Vcd, obtained at the control point of the dummy filter 2, similarly in the main filter 1. However, since the main filter 1 is a high order filter, whose order is secondary or higher, to the dummy filter 2, being a secondary filter, they are different in the filter order. In this case, the control voltage Vcd obtained at a control point of the dummy filter 2 and the desired control voltage Vcm required for the main filter 1 are different.

Therefore, in this embodiment, the interface circuit 6 for converting the control voltage Vcd obtained at the control point of the dummy filter 2 into the desired control voltage Vcm, required for the main filter 1, is provided.

Figure 6:
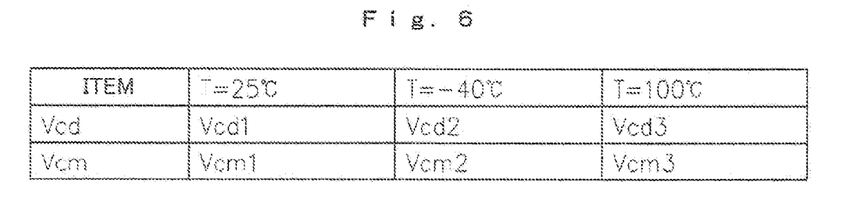
FIG. 6 is a drawing showing an example of the change of amplitude of the difference between the control voltage for a dummy filter, and the control, voltage for a main filter at the time when the surrounding environmental temperature changes.

In addition, when surrounding environmental temperature changes, the control voltage Vcd for the dummy filter 2 obtained by automatic regulation and the control voltage Vcm required to obtain desired frequency characteristics in the main filter 1 are fluctuated, and a difference appears also in amplitude of a difference between both control voltages. FIG. 6 shows this.

In FIG. 6, Vcd1 to Vcd3 denote values of the control voltage Vcd for the dummy filter 2 which are obtained by automatic regulation under different temperature conditions. In addition, Vcm1 to Vcm3 denote values (values calculated by simulation) of the control voltage Vcm required to obtain the desired frequency characteristics for the main filter 1 under different temperature conditions.

As shown in this FIG. 6, amplitude of a difference between the control voltage Vcd for the dummy filter 2 and the control voltage Vcm for the main filter 1 changes with depending on the surrounding environmental temperature. Hence, when the interface circuit 6 is constructed of a simple level shifter circuit, the preferable control voltage Vcm is obtained only under a certain specific temperature condition, and the preferable control voltage Vcm cannot be obtained under various temperature conditions.

So, in this embodiment, as mentioned above, the desired control voltage Vcm is obtained by arranging the second operational amplifier 7 in the interface circuit 6 between the first operational amplifier 5 and main filter 1, and optimizing the reference voltage Vr of the second operational amplifier 7. Specifically, the most suitable control voltage Vcd for the dummy filter 2, and the most suitable control voltage Vcm for the main filter 1 (both are equivalent to the desired values of the present invention) are obtained from a simulation result at normal temperature (25° C.) of surrounding environmental temperature under a recommended value of supply voltage VDD. Then, the most suitable control voltage Vcm for the main filter 1 is generated by defining Vcd−Vcm=ΔV and constructing the interface circuit 6 using the second operational amplifier 7 with the reference voltage Vr of ΔV.

From a table shown in the above-described FIG. 6, it turns out that the control voltage for the dummy filter 2 which is obtained by a control loop using the dummy filter 2 is Vcd1 and the most suitable control voltage for the main filter 1 is Vcm1, under normal temperature (25° C.) of environmental temperature. Here, it is defined as Vcd1−Vcm1=ΔV1. In FIG. 2, let R3 =R4 and let a control voltage obtained in an output of the second operational amplifier 7 be Vcm1, and the control voltage Vcm1 is obtained as Formula 1 in FIG. 7. Nevertheless, it is defined as R5=R6.

Figure 7:
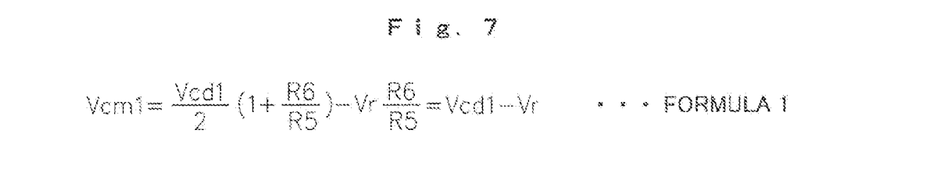
FIG. 7 is a drawing showing a control voltage obtained in an output of a second operational amplifier in this embodiment.

From the above-described Formula 1, Vcd1−Vcm1=Vr is obtained. Hence, by generating the reference voltage Vr having the value of ΔV1, it is possible to obtain the desired control voltage Vcm1 for the main filter 1. However, this value is a value at normal temperature (25° C.) and a recommendation supply voltage. Then, in order to solve the problem that the frequency characteristics of the main filter 1 change with environmental variations etc., it is made to fluctuate the reference voltage Vr of the second operational amplifier 7 depending on the change of the surrounding environmental temperature, the supply voltage VDD, or the like.

Figure 4:
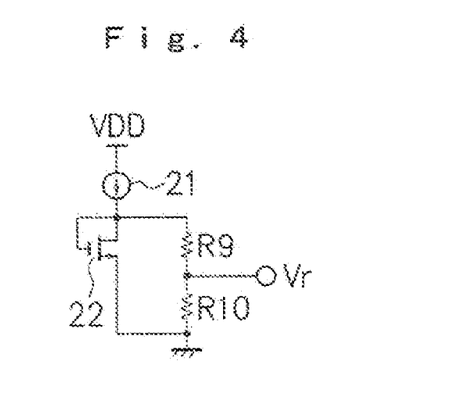
FIG. 4 is a diagram showing a structural example of a reference voltage generation circuit according to this embodiment.
Figure 5A:
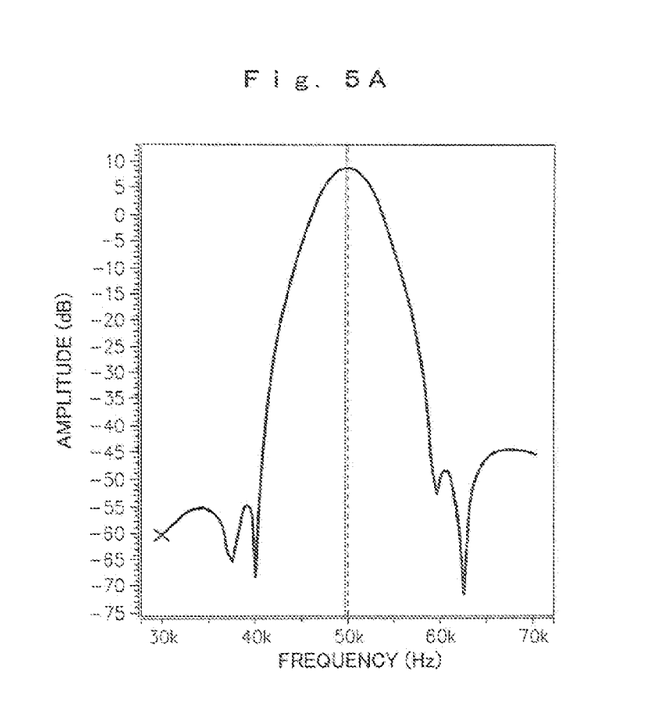
FIG. 5A is a frequency characteristic chart showing a result of performing a simulation using the automatic regulator of a filter according to this embodiment.
Figure 5B:
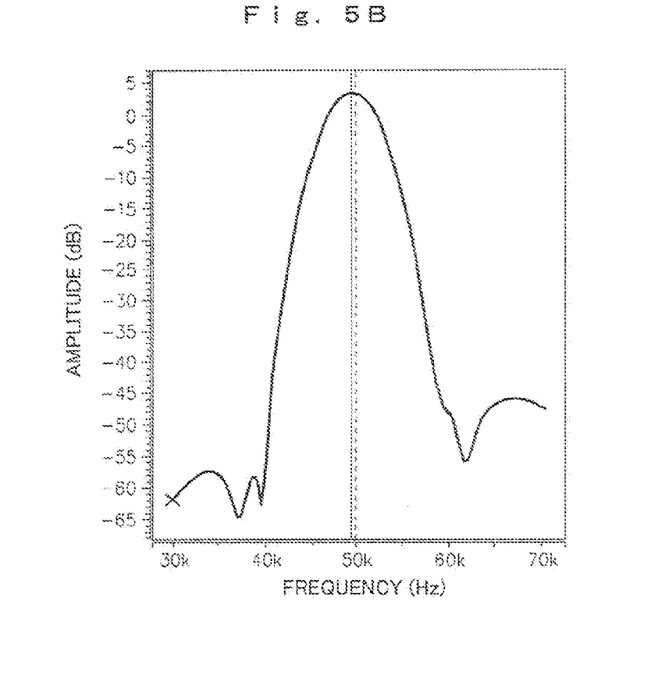
FIG. 5B is a frequency characteristic chart showing a result of performing a simulation using the automatic regulator of a filter according to this embodiment.
Figure 5C:
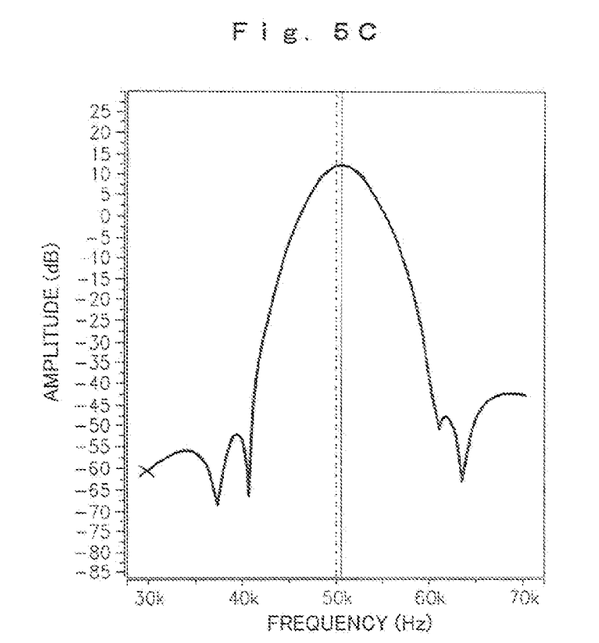
FIG. 5C is a frequency characteristic chart showing a result of performing a simulation using the automatic regulator of a filter according to this embodiment.
Figure 5D:
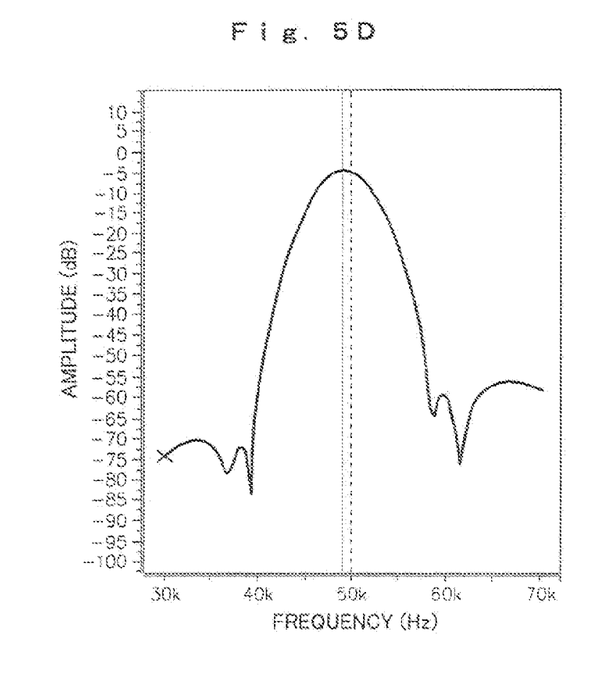
FIG. 5D is a frequency characteristic chart showing a result of performing a simulation using the automatic regulator of a filter according to this embodiment.
Figure 5E:
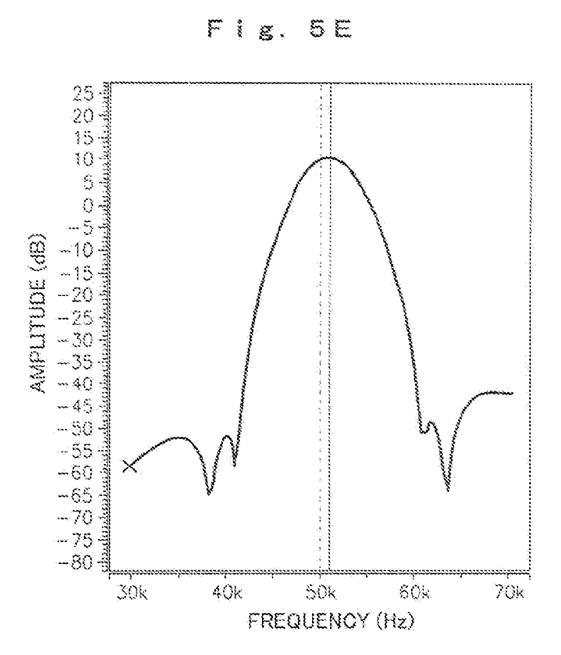
FIG. 5E is a frequency characteristic chart showing a result of performing a simulation using the automatic regulator of a filter by this embodiment.
Figure 5F:
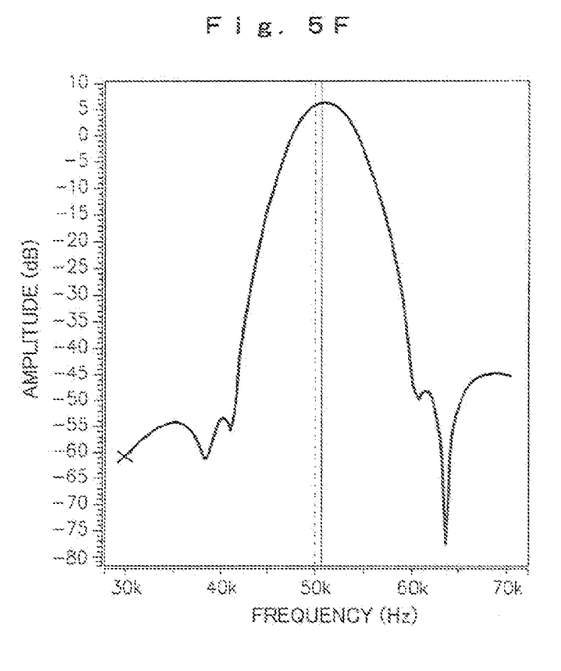
FIG. 5F is a frequency characteristic chart showing a result of performing a simulation using the automatic regulator of a filter by this embodiment.

Therefore, a reference voltage generation circuit is constructed, for example, as shown in FIG. 4. As shown in FIG. 4, the reference voltage generation circuit in this embodiment is constructed of a constant current circuit 21 connected to a power source of the supply voltage VDD, a MOS diode 22 connected to the constant current circuit 21, and resistors R9 and R10 (these are equivalent to the second resistors for voltage dividing according to the present invention). A drain and a gate of the MOS diode 22 are connected each other. The resistors R9 and R10 generate the reference voltage Vr by performing voltage dividing of the threshold level voltage Vth of the MOS diode 22 according to a resistance ratio. Since the threshold level voltage Vth of the MOS diode 22 changes with depending on environmental temperature, it is possible to make the reference voltage Vr have temperature dependence. In addition, since this reference voltage Vr is made from the supply voltage VDD, it is possible to make the reference voltage Vr have source voltage dependence.

Figure 8:
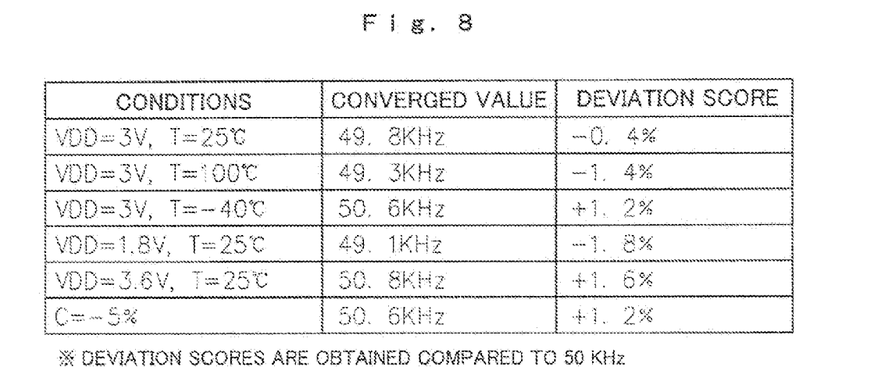
FIG. 8 is a drawing showing conditions at the time of performing a simulation using the automatic regulator of a filter according to this embodiment.

FIGS. 5A to 5F are frequency characteristic charts showing results of performing simulations on various conditions, shown in FIG. 8 described below, using the automatic regulator of a filter constructed as mentioned above. In addition, here, control characteristics at the time when a 16th BPF is achieved by a Gm-C filter with making construction of the main filter 1 into the following are shown. A 6th condition shown in FIG. 8 is the same as the 1st condition regarding the supply voltage VDD and environmental temperature, and has a different value of the capacitor C in the Gm-C filter.

<Construction of Main Filter 1>
Input BPF: Connection of two stages of secondary BPFs
BPF: 4th order in upper side and 4th order in lower side
Output BPF: Connection of two stages of secondary BPFs As apparent from these FIG. 8 and FIGS. 5A to 5F, regardless of a value of the supply voltage VDD or environmental temperature, a center frequency of the BPF which is the main filter 1 hardly shifts from 50 kHz of a desired value, and hence, a deviation from the desired value is merely slight. In this way, according to this embodiment, even if the order of the dummy filter 2 differs from the order of the main filter 1, or there is fluctuation of the supply voltage VDD and surrounding environmental temperature, it is possible to obtain the desired control voltage Vcm required to regulate the frequency characteristics of the main filter 1 to the desired characteristics, and hence, it is possible to obtain the desired frequency characteristics almost near an ideal.

In addition, the above-mentioned embodiments are only What show examples of embodiments at the time when executing the present invention, and a technical scope of the present invention must be not restrictively interpreted by these. That is, the present invention can be implemented in various forms without deviating from its spirit or its main features.

INDUSTRIAL APPLICABILITY

The present invention is useful to an apparatus which regulates frequency characteristics of a main filter which performs predetermined filtering processing to an input signal, using a dummy filter.

The invention claimed is:

1. An automatic regulator of a main filter, comprising:
the main filter which performs original filtering processing to an input signal;
a dummy filter which is constructed in the same form as that of the main filter;
a first operational amplifier provided in order to raise a gain of a control loop which generates a control voltage for the dummy filter; and
an interface circuit which converts the control voltage for the dummy filter outputted from the first operational amplifier to generate the control voltage for the main filter,
the interface circuit comprises a second operational amplifier, and a voltage having a value equal to a difference between a desired value of the control voltage of the main filter required to obtain desired frequency characteristics of the main filter, and a desired value of the control voltage of the dummy filter required to obtain a desired frequency characteristic of the dummy filter is fed as a reference voltage of the second operational amplifier.

2. The automatic regulator of the main filter according to claim 1, further comprising:
a bias voltage generation circuit which generates a bias voltage applied to the first operational amplifier, and the bias voltage generation circuit comprises:
first resistors for voltage dividing which perform voltage dividing of a supply voltage according to a resistance ratio; and
a third operational amplifier which inputs and amplifies the voltage divided by the first resistors for voltage dividing, and outputs a result thereof as the bias voltage.

3. The automatic regulator of the main filter according to claim 1, further comprising:
a reference voltage generation circuit which generates the reference voltage, and the reference voltage generation circuit comprises:
a constant current circuit connected to a power source;
a MOS diode which is connected to the constant current circuit, and whose drain and gate are connected each other; and
second resistors for voltage dividing which perform voltage dividing of a threshold level voltage of the MOS diode according to a resistance ratio, and outputs the divided voltage as the reference voltage.

* * * * *